Feb. 26, 1957 R. J. HERBERT 2,783,197

METHOD OF MAKING BROAD AREA SEMI-CONDUCTOR DEVICES

Filed Jan. 25, 1952

Inventor:
Robert J. Herbert,
by Merton D. Morse
His Attorney.

United States Patent Office 2,783,197

Patented Feb. 26, 1957

2,783,197

METHOD OF MAKING BROAD AREA SEMI-CONDUCTOR DEVICES

Robert J. Herbert, Schenectady, N. Y., assignor to General Electric Company, a corporation of New York Application January 25, 1952, Serial No. 268,272

4 Claims. (Cl. 204—143)

Figure 1:
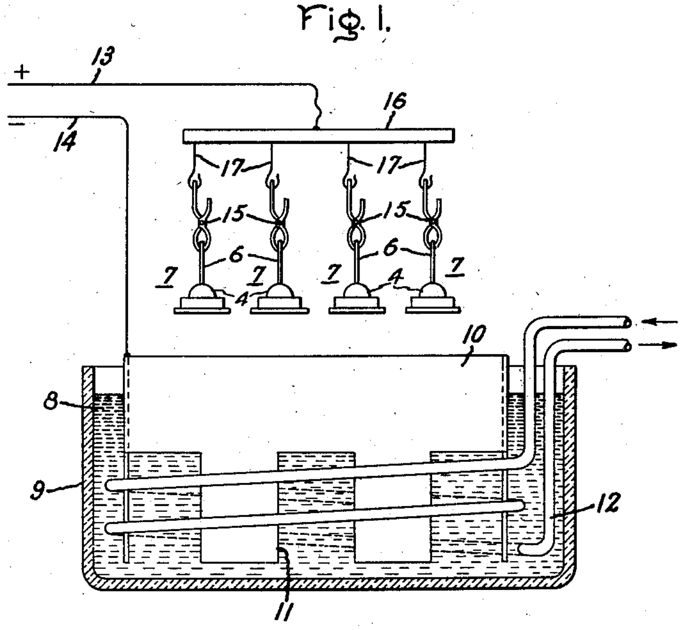

The present invention relates to an improved method of making broad area semi-conductor devices such as rectifiers and transistors and particularly to an improved method of removing the short circuit from the rectification barrier or P–N junction as produced during the manufacture of such devices.

In copending Hall application, Serial No. 187,478, filed September 29, 1950, and assigned to the assignee of this invention, is described and claimed an improved method of producing broad area asymmetrically conductive devices by a heating cycle during which an impurity is diffused into the semi-conductor crystal or wafer to provide a P–N junction. The P–N junction or rectification barrier lies in the alloy region made up of the diffused impurity and the semi-conductor.

As described in the aforementioned Hall application, this method of producing semi-conductor devices is applicable to such semi-conductors as germanium and silicon which are either P-type, N-type or intrinsic, depending upon whether they are positive, negative or neither positive nor negative and determined primarily by the type and sign of the predominant conduction carriers present in the semi-conductor. For example, if a wafer of N-type germanium is to be prepared into a semi-conductor device in accordance with the method of the Hall application, it is necessary to diffuse into one region of the wafer an acceptor impurity which, for example, may be selected from the group of materials including aluminum, gallium and indium, with indium as a preferred material. In a similar manner if P-type germanium is used, it is necessary to diffuse into one region of the germanium wafer a quantity of donor impurity which may be selected from the group consisting of antimony, phosphorus and arsenic with antimony a preferred material. Where intrinsic semi-conductor material is employed, it is necessary to diffuse both acceptor and donor impurities into adjacent regions to a partial depth in order to provide a P–N or rectification barrier. Even where N or P-type germanium is employed it is common practice to attach a base electrode to a region of the crystal or wafer remote from the area in which the impurity is diffused. In order not to destroy the character of the P–N junction, it is important that any material such as a solder used for attaching the base electrode be ohmic or opposite in nature to that of the diffused impurity so that if an N-type wafer having an acceptor impurity diffused into it is used and a base electrode is attached to an opposed area, it should be attached with a solder which is a donor. In the remainder of the specification a specific example of a semi-conductor device will be referred to and this device will comprise a germanium wafer with a diffused impurity of indium on one surface, a base electrode secured to an opposed surface by an antimony solder. It will be appreciated, however, in view of the foregoing discussion that the invention is not limited to semi-conductor devices constructed of these particular materials, although it has been found that these materials are very desirable from a commercial point of view.

As described in the aforementioned Hall application, it has been appreciated that a short circuit is formed at the P–N junction during formation of the junction and that this short circuit must be removed to render the device fully operative. The present invention involves the discovery that a controlled electrolytic etch of the rectifier attacks the semi-conductor preferentially and gives a resulting product of good electrical characteristics which may be reproduced in quantity production.

It is accordingly an important object of the present invention to provide a new, improved and readily controlled process for removing the short circuit from the rectification barrier of semi-conductor devices of the diffused impurity broad area type.

Figure 2:
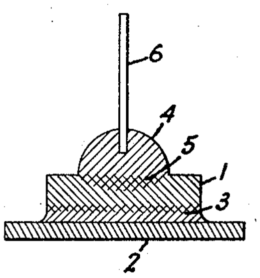
Figure 3:
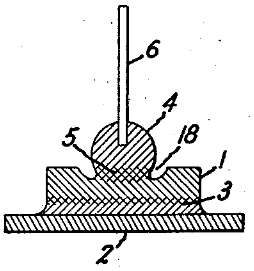

Further objects and advantages will become apparent as the following description proceeds, reference being had to the accompanying drawing and its scope will be pointed out in the appended claims. In the drawing, Fig. 1 illustrates apparatus suitable for carrying out my invention; Fig. 2 illustrates a germanium rectifying device to which my invention is applicable; Fig. 3 illustrates the device of Fig. 2 after processing in accordance with my invention.

Referring now to Fig. 2 of the drawing, there is shown a broad area diffused impurity germanium rectifying device of the type described and claimed in the above-identified Hall application. As illustrated, this device includes a body of N-type germanium 1 soldered to a base electrode 2 of suitable conducting material, such as one of the iron-nickel-cobalt alloys by a layer of solder metal 3 which is a donor material. Antimony is a preferred example of this class of material which also includes arsenic, phosphorus and alloys thereof. On the opposite face of the germanium member is a dot 4 of acceptor material, preferably indium, which is diffused into the germanium as previously mentioned. It is generally accepted that the rectification barrier of the device lies in the region of the indium-germanium alloy resulting from this diffusion and illustrated at 5. A nickel or nickel plated conductor 6 may be embedded in and secured to the indium dot 4 during the diffusion process.

It has been recognized that, in devices of this character, the rectification barrier is shortcircuited at the edges after formation and it has been suggested that an acid non-electrolytic etch be employed to remove the short circuit. With an acid etching process it is hard to control the amount of etching so the resulting product is non-uniform. Also, the impurity such as indium is attacked preferentially. A substantial portion of the indium is etched away before sufficient germanium or germanium indium alloy is removed to eliminate the short circuit. The materials handled also present a hazard in carrying out the process on a commercial scale and the disposal of the waste products presents a serious problem.

Referring now to Fig. 1, my invention will be described with particular reference to suitable apparatus for carrying out the etching of a plurality of germanium rectifying devices 7. The etching solution 8 is contained in a suitable vessel such as a glass jar 9. The solution may be a water solution of either potassium hydroxide or sodium hydroxide. The concentration may be from 10 to 40 grams of hydroxide per 100 cubic centimeters of water with a preferred range being 20 to 30 grams per 100 cubic centimeters of water. In general, the potassium hydroxide works the same as the sodium hydroxide but requires a lower voltage for the same etching current.

The cathode 10 of the cell is provided by a rectangular stainless steel sleeve open at the top and bottom and provided in the lower portion of the side wall with a plurality of openings 11 to allow for circulation of electrolyte. The electrolyte is cooled by suitable cooling coils 12 immersed in the jar 9 and surrounding the cathode 10. Water may be circulated through the coils to maintain the electrolyte at constant temperature. As will be readily appreciated by those skilled in the art, the amount of etching increases with increased temperature and therefore constant temperature is desirable to maintain the etching rate more constant. For ease of control, the electrolyte may be maintained at room temperature or about 25° C. although it may be maintained constant at any higher value, if desired.

Referring now to Fig. 1, the germanium diodes 7 are supported in generally equally spaced relation and connected by means of the indium dots 4 with the positive line 13 of a direct current supply circuit. The negative line 14 is connected with the cathode sleeve 10.

The connections to the individual units 7 may be made by spring clips 15 which releasably engage the conductors 6. The clips are supported from a direct current bus 16 by means of a plurality of hooks 17. The metal parts that are immersed in the etching solution should not readily plate off during the etching process. To this end, the parts may be nickel plated or formed of stainless steel.

With the circuit connections described above, the current flow is from the indium to the germanium, the direction of low resistance. It will be noted that only the germanium near the edge of the indium-germanium interface is greatly etched as shown at 18 in Fig. 3, leaving a moat type structure under and around the indium metal. The germanium-indium alloy is also somewhat etched. The high fields created at the interface by flow of current in this direction may account to some extent for the localized etching at the interface.

The time of etching and the etching current are controlled to give the desired result with respect to the characteristics of the final product. While the amount of etching may vary by 50 to 75% without detrimentally effecting the quality of the rectifying units, it is desirable to maintain it reasonably uniform from one device to another of the same type. The amount of etching may be measured in terms of ampere seconds and about 50 to 150 ampere seconds has been found to produce a desirable amount. It has been found that on the average about 100 ampere seconds may be obtained by applying 6 volts to the terminals of a device of the type described in detail in the foregoing specification for 30 seconds. It will be appreciated that the amount of etching for different types of rectifiers will vary but that the desired amount of etching can be established and from then on the quality of the processed rectifying device is readily controlled. As will be readily appreciated, the applied voltage must exceed the forward drop of the cell before appreciable etching current will flow. For voltages in excess of the forward drop voltage, the etching current is approximately proportional to the voltage excess.

What I claim as new and desire to secure by Letters Patent of the United States is:

1. The method of removing the rectification barrier short circuit from the P–N junction of an impurity diffused semi-conductor device including an impurity contact having a substantially smaller surface area than the remainder of said semi-conductor device which comprises immersing the device in a water solution of a hydroxide selected from the group consisting of sodium hydroxide and potassium hydroxide in spaced relation to an immersed electrode, applying a direct current voltage across the impurity contact and the electrode with the impurity contact positive with respect to the electrode to pass an etching current through said device in the direction of low electrical resistance, the product of the etching current in amperes and etching time in seconds falling in the range of 50 to 150.

2. The method of removing the rectification barrier short circuit from a semi-conductor device including a P–N junction having a substantially larger surface area in conductive association with the N-type region of said P–N junction than in conductive association with the P-type region of said P–N junction which comprises immersing said device in a water solution of a hydroxide selected from the group consisting of sodium hydroxide and potassium hydroxide in spaced relation to an immersed electrode, connecting said P-type region to the positive terminal of a direct voltage source to bias said P–N junction in the forward direction and connecting the negative terminal of the direct voltage source to said electrode to pass an etching current through said device in the direction of low electrical resistance.

3. The method of removing the rectification barrier short circuit from a semi-conductor device including a P–N junction having a substantially larger surface area in conductive association with the N-type region of said P–N junction than in conductive association with the P-type region of said P–N junction which comprises immersing said device in an alkaline electrolyte in spaced relation to an immersed electrode, and applying to said region of said P-type conductivity a voltage positive to said bath and to an immersed electrode for a time sufficient to cause a moat to be formed in the surface portion of said N-type region.

4. The method of removing the rectification barrier short circuit from a semi-conductor device including a P–N junction having a substantially larger surface area in conductive association with the N-type region of said P–N junction than in conductive association with the P-type region of said P–N junction which comprises immersing said device in an alkaline electrolyte in spaced relation to an immersed electrode, and applying to said region of said P-type conductivity a voltage positive to said bath and to said immersed electrode.

References Cited in the file of this patent

UNITED STATES PATENTS

| | | |
|---|---|---|
| 2,447,829 | Whaley | Aug. 24, 1948 |
| 2,602,763 | Scaff et al. | July 8, 1952 |
| 2,631,356 | Sparks et al. | Mar. 17, 1953 |
| 2,656,496 | Sparks | Oct. 20, 1953 |